United States Patent [19]

Gewartowski et al.

[11] 4,028,637
[45] June 7, 1977

[54] PARAMETRICALLY-STABLE NEGATIVE RESISTANCE DIODE CIRCUIT

[75] Inventors: James Walter Gewartowski, Allentown; William Edward Schroeder, Coopersburg, both of Pa.

[73] Assignee: Bell Telephone Laboratories, Incorporated, Murray Hill, N.J.

[22] Filed: June 14, 1976

[21] Appl. No.: 695,584

[52] U.S. Cl. .............................. 331/107 R; 330/34; 330/4.5
[51] Int. Cl.² ...................... H03F 3/10; H03B 5/12
[58] Field of Search .................. 331/107 R, 107 G; 330/34

[56] References Cited

UNITED STATES PATENTS

| | | | |
|---|---|---|---|
| 3,534,293 | 10/1970 | Harkless | 331/107 |
| 3,792,375 | 2/1974 | Brackett | 331/96 |
| 3,836,863 | 9/1974 | Seidel | 330/53 |

Primary Examiner—Rudolph V. Rolinec
Assistant Examiner—Darwin R. Hostetter
Attorney, Agent, or Firm—Lucian C. Canepa

[57] ABSTRACT

A parametrically-stable microwave circuit comprises in cascade a negative resistance diode, a stabilizing network, and a complementary type filter. The complementary type filter presents a substantially constant impedance to the stabilizing network from low frequencies to the operating frequency by selectively coupling the diode microwave signals to a dummy load or to a circuit load. With its termination thus controlled, the stabilizing network may be designed to suppress spurious parametric oscillations by presenting to the negative resistance diode a predetermined impedance over a broad range of frequencies.

10 Claims, 7 Drawing Figures

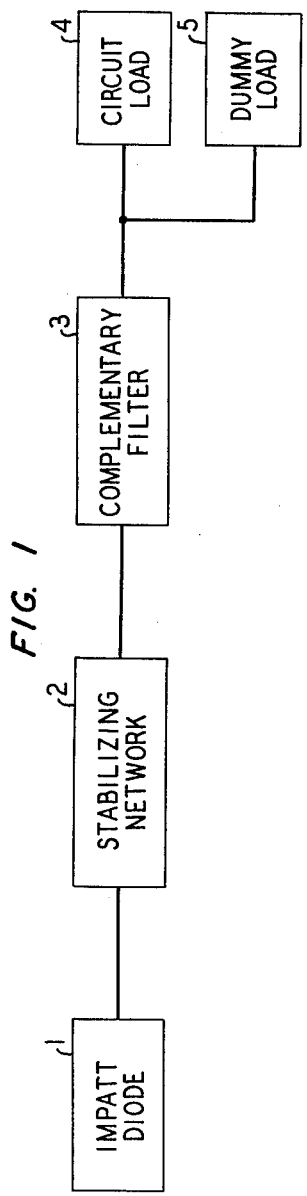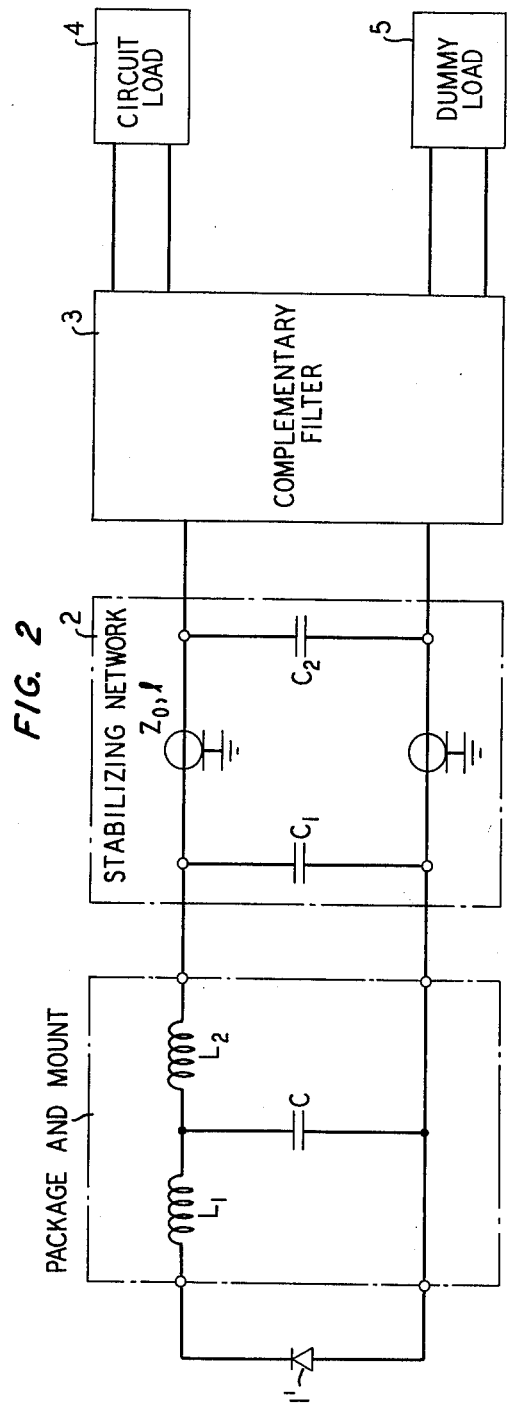

PARAMETRICALLY-STABLE NEGATIVE RESISTANCE DIODE CIRCUIT

BACKGROUND OF THE INVENTION

The present invention relates to negative resistance microwave circuits, and more particularly to parametrically-stable microwave circuits using an IMPATT diode as the active element.

Large signal parametric instabilities in IMPATT diode circuits are discussed in an article by W. E. Schroeder entitled "Spurious Parametric Oscillations in IMPATT Diode Circuits" in the Bell System Technical Journal, Vol. 53, No. 7, September 1974, pages 1187-1210. According to this article, spurious oscillations are frequently observed in strongly driven IMPATT amplifiers and oscillators. In the case of an amplifier, such spurious oscillations result in a signal frequency at the output not present at the input of such an amplifier. In the case of an oscillator, there is a signal present in addition to the main desired oscillation due to such spurious oscillations. In IMPATT diode circuits, the two most frequently observed spurious oscillations are the parametric-pair type and the subharmonic type instability. In the former type, two spurious signals have frequencies adding up to the desired signal frequency, i.e., the pump signal frequency, while in the latter type a spurious signal occurs at one half the frequency of the pump signal. Accompanying the onset of spurious oscillations, there is often a premature saturation of rf output power, a degradation of the circuit noise performance, and/or a shift in the center frequency of the locking band. In order to suppress parametric-pair oscillations, it is necessary to control the impedance present to the diode over a very broad frequency range.

One approach used to achieve broadband impedance control in IMPATT diode circuits is described in U.S. Pat. No. 3,534,293 to E. T. Harkless, issued Oct. 13, 1970, and assigned to applicants' assignee, wherein a circuit load is coupled to the diode via a high-Q resonant cavity. Away from the resonant frequency of the cavity, the circuit load is decoupled and the diode signals are coupled to a dissipative load. In other words, only energy within the bandwidth of the resonator is transmitted through the resonator to the circuit load, while energy at other frequencies is dissipated in a dissipative impedance. This known technique appears to be limited to microwave circuits wherein a high Q is acceptable. However, in amplifiers and in a locked-oscillator-type amplifier wherein a low Q is mandatory, this known arrangement is not easily applicable. Also, due to the resonant cavity inserted in the circuit, rf power losses in the cavity and in the dissipative impendance are unavoidable.

In U.S. Pat. No. 3,792,375 to C. A. Brackett, issued Feb. 12, 1974, and assigned to applicants' assignee, spurious bias circuit oscillations in IMPATT oscillators are suppressed by inserting in the bias circuit a filter including an inductance shunted by a dissipative resistance thereby providing a low-loss path for the dc bias current. This known arrangement is directed to avoid burnout of negative resistance diodes when operated at moderate power levels. However, this known technique is ineffective for suppressing parametric spurious oscillations in strongly driven IMPATT diode circuits such as amplifiers and oscillators operating at high rf levels.

A broadband frequency steering network connected across the two terminals of an IMPATT diode is described in U.S. Pat. No. 3,836,863 to H. Seidel, issued Sept. 17, 1974, and assigned to applicants' assignee. The frequency steering network comprises an array of $n$ reactive couplers each having a predetermined set of coupling parameters. This known network provides a broadband resistance having a prescribed resistance-frequency characteristic for suppressing spurious oscillations in the bias circuit of IMPATT amplifiers and oscillators, which spurious oscillations are of the type discussed in the above patent to C. A. Brackett. Thus, the thrust of this known arrangement is to couple a direct current bias source to an IMPATT oscillator through an essentially resistanceless path while simultaneously loading the diode with a positive resistance independent of the bias source output resistance.

BRIEF DESCRIPTION OF THE INVENTION

The foregoing problem of suppressing spurious parametric oscillations in a microwave circuit is solved in accordance with an illustrative embodiment of the present invention wherein the circuit comprises a negative resistance diode for generating microwave signals, a stabilizing network coupled to the diode for presenting to the diode a predetermined impedance over a broad range of frequencies thereby suppressing spurious oscillations in the circuit, and filter means coupled to the network for selectively coupling the diode signals to a dummy load or a circuit load and presenting to the network a substantially constant impedance from low frequencies to the operating frequency.

In a preferred embodiment of the present invention, the microwave circuit comprises a filter arrangement for coupling the stabilizing network to the circuit load over a frequency range where the circuit load is well matched, while at all other frequencies coupling the stabilizing network to the dummy load.

In one illustrative embodiment of the present invention, the filter arrangement is of the substantially complementary band-pass/band-stop type. In accordance with another illustrative embodiment of the present invention, the filter arrangement is of the substantially complementary high-pass/low-pass type.

One object of the present invention is to substantially suppress spurious parametric oscillations in high power microwave circuits.

Another object of the present invention is to increase the rf output power from IMPATT diode amplifiers and oscillators.

A still further object of the present invention is to achieve a testing arrangement for a wide range of microwave diode parameters and test frequencies wherein the diode is driven to power saturation without the occurrence of spurious tones.

These and other objects and advantages of the present invention will appear more fully upon consideration of the various illustrative embodiments now to be described in detail in connection with the accompanying drawings.

BRIEF DESCRIPTION OF THE DRAWINGS

FIG. 1 shows, in block diagram, a parametrically stable microwave circuit in accordance with a preferred embodiment of the present invention;

FIG. 2 shows, partially in circuit diagram, the parametrically-stable microwave circuit of FIG. 1;

DETAILED DESCRIPTION OF THE DRAWING

Figure 3:
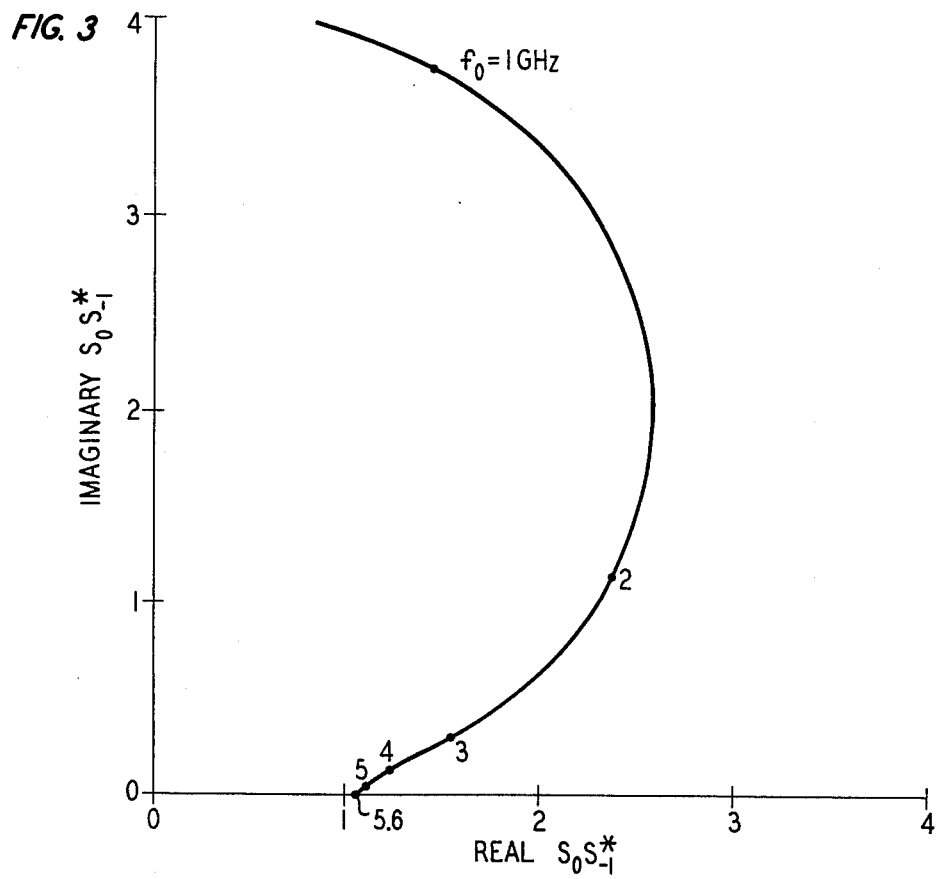
FIG. 3 shows a stability diagram of the microwave circuit of FIG. 2.

FIG. 1 shows the different components of a microwave circuit in accordance with an illustrative embodiment of the invention. The circuit comprises a negative resistance diode 1, for example an IMPATT diode, coupled to a stabilizing network 2, the latter controlling the impedance presented to the diode over a broad frequency range.

The design of the stabilizing network 2 is simplified if the load impedance is substantially constant from low frequencies to the rf operating frequency. A broadband match, such as 50 ohms, is probably ideal. However, for a microwave amplifier or oscillator, the actual load circuit is usually well matched only over part of this frequency range. This is due to the limited bandwidth of either a circulator, a waveguide, or an isolator coupling the system load to the diode. Therefore, it is advantageous to use a coupling circuit interposed between the stabilizing network 2 and the system load 4 such that the latter is coupled to the network only over a frequency range where it is matched.

In the preferred embodiment of the invention as shown in FIG. 1, the coupling circuit is a complementary type filter 3 coupled to the output of the stabilizing network 2. The purpose of such a filter, as described above, is to present a constant impedance, e.g., 50 ohms, to the stabilizing network 2 from low frequencies to the operating frequency. The complementary filter 3 couples the diode rf output signals to the system load 4, substantially without loss, over a frequency range where the load is well matched. At all other frequencies, i.e., in a range from low frequency to the operating frequency, the complementary filter 3 couples the stabilizing network to a dummy load 5.

The design of a parametrically-stable circuit for an IMPATT diode may be approached as indicated in FIG. 2. At the outset, the small-signal admittance parameters of the diode 1 must be known. In addition, the package and mount equivalent circuit, as well as the circuit load into which the diode must deliver rf power, are specified. The task is to design a circuit to be placed between the mounted diode 1 and the circuit load 4 which will have satisfactory stability properties and in addition meet certain constraints. Such constraints may include, for example, the condition that the circuit impedance should match the negative diode impedance at a specified frequency so that the diode will oscillate at a desired power level. Alternatively, the circuit impedance should lie on some locus so that a given power gain at a given frequency is realized. Moreover, the circuit should have a high or low Q, depending on its application as an oscillator or amplifier. Furthermore, in the baseband frequency range, the circuit impedance should be sufficiently high to suppress bias-circuit oscillations and upconverted noise.

Figure 4A:
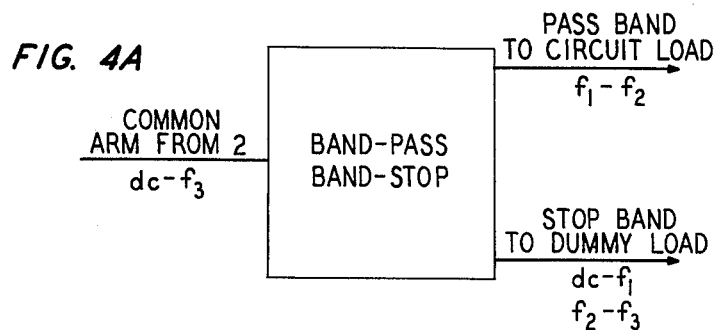
FIGS. 4A and 4B show two embodiments of the complementary filter of FIG. 1.
Figure 4B:
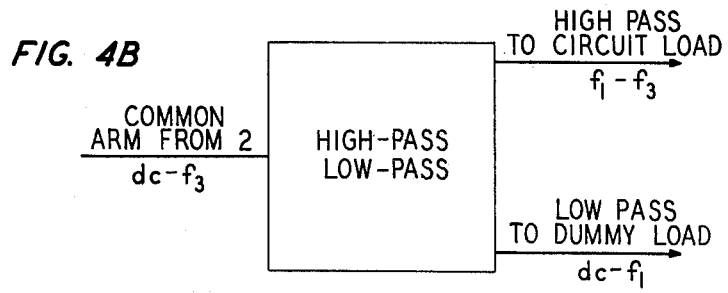

In the illustrative embodiment of the invention shown in FIG. 2, the IMPATT diode is mounted at the end of a section of a 50 ohm coaxial line. The equivalent circuit of the mounted diode comprises the diode wafer 1' and a package-mount network the equivalent circuit of which may be an L-C tee, wherein $L_1$ is 0.27 nH, $L_2$ is 0.2 nH and C is 0.435 pF. An example of a stabilizing network used to present to the IMPATT diode 1 a predetermined impedance over a broad range of frequencies, comprises a section of transmission line ($Z_o$, $l$) having shunt capacitances $C_1$ and $C_2$ at each end. A complementary type filter 3 has its input terminals coupled to the output section of the stabilizing network 2. A first pair of output terminals of the filter 3 is coupled to the circuit load 4, and a second pair of output terminals of the filter is coupled to a dummy load 5. Complementary type filter 3 can be of the conventional bandpass/bandstop type as shown in FIG. 4A, or the conventional high-pass/low-pass type as shown in FIG. 4B. If the bandpass/bandstop type is used, the passband should be within the range where the circuit load 4 is well matched, and the dummy load 5 should be well matched from a low frequency $f_o$ to $f_1$ and from $f_2$ to $f_3$. Usually $f_3$ will be slightly above the operating frequency band. Alternatively, if a high-pass/low-pass complementary type filter is used, the high-pass band should be within the range where the circuit load 4 is well matched, and the dummy load 5 should be well matched from $f_o$ to $f_1$. These two types of filters are called complementary because the common arm of each in FIGS. 4A and 4B is matched over both bands, this facilitating the design of the stabilizing network 2 as discussed above.

For frequencies less than the above-mentioned low frequency $f_o$, the impedance presented to the diode should be sufficiently high to suppress bias-circuit oscillations and upconverted noise, as described in the above-cited patent to C. A. Brackett. The magnitude of the low frequency $f_o$ depends upon the impedance presented to the diode at the operating frequency, and is typically less than, or equal to, one fourth the operating frequency. Thus, it is usually desirable to have the low frequency arm of the complementary filter terminated in a high impedance mismatch below $f_o$. It has been found theoretically and experimentally that this can be done without substantially affecting the parametric stability.

In the stabilizing network 2 of FIG. 2 there are four degrees of freedom: $C_1$, $C_2$, $Z_o$ and $l$. The impedance constraint mentioned above reduces the number of independent variables to 2, which could be taken to be $C_2$ and $Z_o$. For a specific choice of $Z_o$ and $C_2$, there are either two, one or no solutions for $l$. Additional values of $l$ which are integer multiples of a half-wavelength longer than the primary solutions for $l$ also satisfy the constraint. However, these longer lengths have been generally found to be less stable than the minimum-length solutions. When there are two solutions for $l$, each less than a half-wavelength, the one corresponding to the larger value of $C_1$ generally gives better stability. It has been found that $Z_o$ has little effect on the optimum stability, for example $Z_o$ can be equal to 50 ohms for convenience. In such a case, with a GaAs IMPATT diode having a flat profile, a breakdown voltage of approximately 50 volts and a junction capacitance of the order of 1 pF, the stability plot for the optimum solution ($C_1 = 1.5$ pF, $l = 0.111$ inches in air-line, $C_2 = 0.6$ pF) is shown in FIG. 3. This is a plot of the complex quantity $S_o S_{-1}{}^*$, where $S_o$ is the stability factor at the lower frequency of a possible parametric pair and $S_{-1}{}^*$ is the complex conjugate of the stability factor at the complementary frequency. The stability curve intersects the real axis at a value of 1.08 at the subharmonic frequency, and this is the only intersection. If the intersection point were at less than one, the circuit would be unconditionally stable. The interpretation of FIG. 3 is that the circuit is stable for all normalized rf pump levels, $M_1$, up to $M_1 = (1.08)^- = 0.96$. Since the output power of the diode is expected to be maximum at $M_1 = 0.8$, this circuit is theoretically stable from small-signal up to and beyond saturation.

Figure 5:
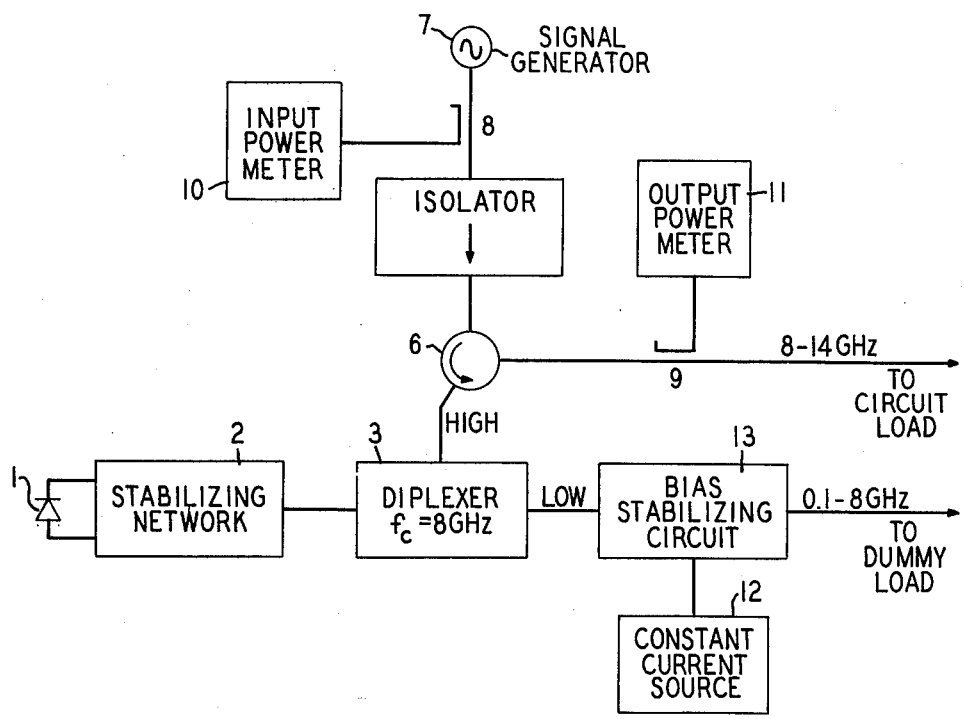
FIG. 5 is a block diagram of an IMPATT diode test circuit using the various principles of the present invention.

An IMPATT diode testing circuit using the principles of the preset invention is shown in FIG. 5. When testing microwave diodes, it is desirable to have a fixed-tuned circuit which may be calibrated once and which does not require retuning for different diodes or test frequencies. In FIG. 5, and IMPATT diode 1 is coupled to a stabilizing network 2, for example of the type described above in connection with the embodiment of FIG. 2. A high-pass/low-pass complementary type filter 3 is coupled to the output side of the stabilizing network 2 for presenting to the latter a broadband 50 ohm load. This filter is realized by a commercially available diplexer having a crossover frequency of 8 GHz. A circulator 6, which is well matched from 7 to 12.4 GHz, separates the incident waves generated by a signal generator 7 from the reflected waves at the test frequency. The power levels of the incident and reflected waves are respectively measured by means of directional couplers 8 and 9 and power meters 10 and 11. Thus, the power added by the diode 1 under test can be determined by taking into consideration the small losses in the stabilizing network 2, the diplexer 3 and the circulator 6. DC bias is supplied to the circuit through the low frequency arm of the diplexer 3 by a constant current source 12 and a bias stabilizing circuit 13 of the type, for example, described in the above-cited patent to C. A. Brackett. In this test circuit, the output spectrum of the diode may be routinely checked from 100 MHz to 14 GHz.

The performance of the diplexer 3 is important to the overall stability of the circuit. The impedance presented at the common arm depends upon the match of the diplexer and the match of the high and low port terminations over their bands. The impedance seen looking into the common port is substantially 50 ohms, and it is important to minimize the mismatch of the common arm.

Figure 6:
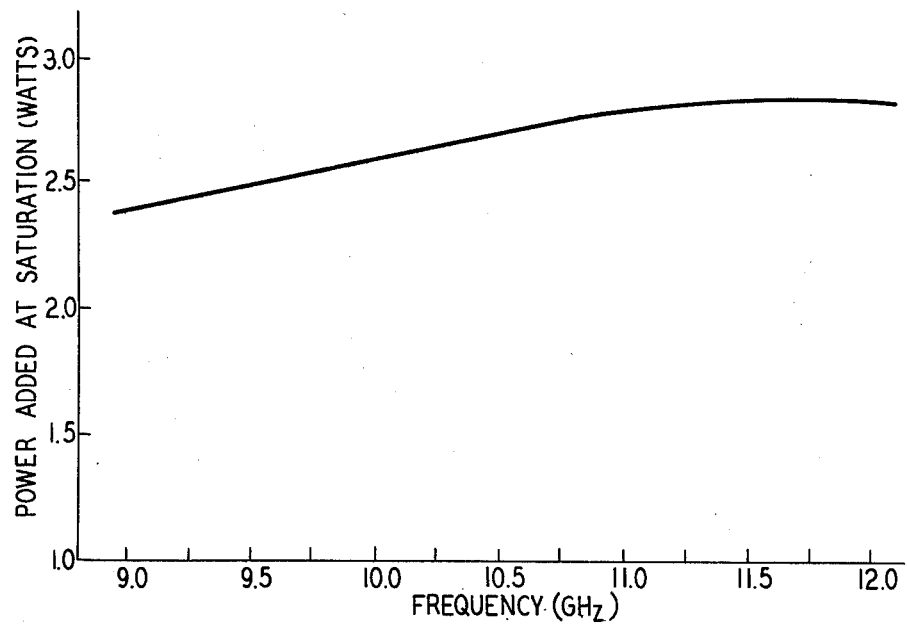
FIG. 6 is a diagram of the output power of the circuit of FIG. 5.

A typical curve for the saturated output power of an IMPATT diode, measured with dc power held constant at 19 W and diode-case temperature equal to 60° centigrade, is given in FIG. 6. Data were taken at 100 MHz intervals from 9 to 12 GHz. At each frequency the input level was varied so that the added power increased, reached a peak, and then decreased with further increases in input power level. During this operation the output spectrum was monitored continuously and no spurious tones were observed. The data from 10 to 12 GHz were obtained with fixed circuit tuning: $C_1 = 1.3$ pF, $C_2 = 0.5$ pF in the stabilizing network 2. The gain at the saturation point varied from 3.5 to 8.6 dB. The diode could have been measured from 9 to 10 GHz without changing the circuit tuning, but gain would have decreased below 3 dB. Since the added power is the difference between the incident and reflected waves, accuracy is degraded with low gain. Therefore, the circuit was returned, by increasing $C_1$ to 1.4 pF leaving all other adjustments fixed, for the 9 – 10 GHz data. As the pump frequency was varied from 9 to 12 GHz, no spurious tones appeared. The stabilizing circuit was designed considering only one pump frequency, 11.2 GHz, and also a diode with higher breakdown voltage.

The circuit may be operated as a conventional stable amplifier, i.e., no rf output when no rf input is applied. Alternatively, it may be deliberately tuned to oscillate near the test frequency and then locked to the input signal. This may be preferable since the accuracy of the added power measurement is improved with high gain, and higher gain at saturation can usually be obtained with a locked oscillator. The test circuit was designed for a fixed, nominal diode, and variations in the diode parameters, such as breakdown voltages ranging from 45 to 55 volts and junction capacitances ranging from 0.9 to 1.1 pF, would not substantially affect the stabiltiy of the circuit. Indeed, it is always possible to finely retune the circuit, for example, by inserting several tuning screws in the line section of the stabilizing network 2 thereby providing small amounts of variable shunt capacitances. This enables a fine adjustment of the circuit for compensating for diode-to-diode variations.

The invention has been described in terms of a limited number of embodiments. It is to be understood that the above-described arrangements are merely illustrative of the application of the principles of the invention. Other arrangements and applications may be devised by those skilled in the art without departing from the spirit and scope of the invention.

What is claimed is:
1. A parametrically-stable microwave circuit comprising:
    a negative resistance diode for generating microwave signals;
    a stabilizing network coupled to said diode for presenting to said diode a predetermined impedance over a broad range of frequencies including a low frequency and an operating frequency, thereby suppressing spurious oscillations in the circuit; and
    means coupled to said network for selectively coupling said signals to a dummy load or a circuit load and presenting to said network a substantially constant impedance from said low frequency to the operating frequency.

2. A parametrically-stable microwave circuit according to claim 1, wherein said negative resistance diode is an IMPATT diode.

3. A parametrically-stable microwave circuit according to claim 2, wherein the low frequency limit is approximately one-fourth of said operating frequency.

4. A parametrically-stable microwave circuit according to claim 3, wherein said means comprise a filter arrangement for selectively coupling the IMPATT diode output signals to the circuit load.

5. A parametrically-stable microwave circuit according to claim 4, wherein the filter couples the stabilizing network to the circuit load over a frequency range where said circuit load is well matched.

6. A parametrically-stable microwave circuit according to claim 5, wherein at all other frequencies the filter couples the stabilizing network to said dummy load.

7. A parametrically-stable microwave circuit according to claim 6, wherein said filter is of the substantially complementary band-pass/band-stop type.

8. A parametrically-stable microwave circuit according to claim 6, wherein said filter is of the substantially complementary high-pass/low-pass type.

9. A parametrically-stable microwave circuit according to claim 6, wherein said circuit is an amplifier.

10. A parametrically-stable microwave circuit according to claim 6, wherein said circuit is an oscillator.

* * * * *

UNITED STATES PATENT AND TRADEMARK OFFICE
CERTIFICATE OF CORRECTION

PATENT NO. : 4,028,637
DATED : June 7, 1977
INVENTOR(S) : James W. Gewartowski and William E. Schroeder It is certified that error appears in the above-identified patent and that said Letters Patent are hereby corrected as shown below:

Column 1, lines 13 and 14, "Bell System Technical Journal" should be in italics; line 36, "present" should be --presented--. Column 5, line 7, "$(1.08)^-$" should be --$(1.08)^{-1/2}$--; line 12, "preset" should be --present--; line 64, "returned" should be --retuned--.

*Signed and Sealed this*

*Twentieth* Day of *September 1977*

[SEAL]

*Attest:*

RUTH C. MASON
*Attesting Officer*

LUTRELLE F. PARKER
*Acting Commissioner of Patents and Trademarks*